United States Patent [19]

Bierhenke

[11] 3,889,358

[45] June 17, 1975

[54] PROCESS FOR THE PRODUCTION OF HIGH VALUE OHMIC LOAD RESISTORS AND MOS TRANSISTORS HAVING A LOW STARTING VOLTAGE

[75] Inventor: Hartwig Bierhenke, Zorneding, Germany

[73] Assignee: Siemens Aktiengesellschaft, Berlin & Munich, Germany

[22] Filed: Sept. 14, 1973

[21] Appl. No.: 397,402

[30] Foreign Application Priority Data

Sept. 26, 1972 Germany ............................ 2247183

[52] U.S. Cl. ........................ 29/571; 29/577; 29/578; 357/41; 357/51; 357/91

[51] Int. Cl. ............................................. B01j 17/00

[58] Field of Search ............ 29/571, 576 B, 577, 578, 29/576; 317/235

[56] References Cited

UNITED STATES PATENTS

| | | | |
|---|---|---|---|
| 3,605,256 | 9/1971 | Schmitz | 29/577 |
| 3,655,457 | 4/1972 | Duffy | 29/576 B |
| 3,679,492 | 7/1972 | Fang | 29/571 |
| 3,789,504 | 2/1974 | Jaddam | 29/571 |

*Primary Examiner*—Roy Lake
*Assistant Examiner*—W. C. Tupman
*Attorney, Agent, or Firm*—Hill, Gross, Simpson, Van Santen, Steadman, Chiara & Simpson

[57] ABSTRACT

In a process for the production of circuits having at least one field effect transistor including a source, a drain, and a gate electrode, and having a resistor on a common substrate in which, starting with a substrate body having at least one field effect transistor, the process includes the formation of an enhancement type field effect transistor by ion implantation in the channel to decrease the starting voltage and the formation of the resistor by ion implantation adjacent the field effect transistor, wherein the resistor has a value which is high in comparison with the forward resistance of the conductive field effect transistor and low in comparison with the reverse resistance of the field effect transistor.

7 Claims, 4 Drawing Figures

PROCESS FOR THE PRODUCTION OF HIGH VALUE OHMIC LOAD RESISTORS AND MOS TRANSISTORS HAVING A LOW STARTING VOLTAGE

BACKGROUND OF THE INVENTION

1. Field of the Invention

This invention relates to a process for the production of circuits having at least one field effect transistor and a load resistor on a common substrate, and more particularly to the production of such circuits by ion implantation to provide an enhancement type field effect transistor with a low starting voltage and a resistor having a value which is high in comparison to the forward resistance of the transistor and low in comparison with the reverse resistance of the transistor.

2. Description of the Prior Art

Circuits of the general type set forth above are well known in the art. The transistors, which are of the normally-off type (enhancement type) are to possess a starting voltage which is as low as possible in order to enable the supply voltage and the power loss of the circuits to be kept at a low value. A transistor of the normally-off type is to be understood to be a transistor which is in the blocked state when the gate voltage is OV with respect to the potential of the source electrode. The resistances in these types of circuits, which serve as high value ohmic load elements, are to have values which are high in comparison to the forward resistance of the switch transistor, but low in comparison to the very high reverse resistance of the switching transistor.

It is known to produce load resistors of this type by means of ion implantation. In comparison to load resistors consisting of transistors of the enhancement type, ohmic load resistors possess the advantage that they do not have starting voltages.

It is also known in the art to reduce the starting voltage of field effect transistors with the aid of ion implantation by introducing additional charge carriers into the channel zone of these transistors.

SUMMARY OF THE INVENTION

An object of the present invention is to provide a process the production of a circuit having at least one field effect transistor and at least one resistor, in which the starting voltage of the field effect transistor may be reduced and the ohmic resistor produced in each case in a technically simple fashion.

This object is achieved through a process which features an ion implantation step in which the resistor is produced and ions are simultaneously implanted in the channel zone of the field effect transistor to decrease the starting voltage, wherein the implanted quantity of ions and the ion energy thereof are selected to be such that a field effect transistor of the enhancement type is formed and the resistor so formed possesses a value which is high in comparison to the forward resistance of the conductive field effect transistor and low in comparison to the reverse resistance of the field effect transistor.

An advantage of the process of the present invention resides in the provision of a considerably simpler process for the production of the above described circuits than has heretofore been known for circuits comprising field effect transistors and resistors in, for example, the conventional single channel MOS technique.

A further advantage of the process of the present invention resides in the provision of circuits which require less area and exhibit a lower power loss than, for example, the circuits of the conventional single channel MOS technique produced without ion implantation.

Preferably, the process, according to the invention, is utilized to produce circuits in accordance with MOS techniques. Here, the substrate will preferably consist of n-silicon into which a p-conducting source zone and a p-conducting drain zone are diffused. A silicon dioxide layer is arranged on the substrate and is sufficiently thin to enable implantation to take place through such substrate at those points at which ion implantation is to be effected, i.e. at those points at which the channel zone of the field effect transistors and the regions of the ohmic resistors are arranged. In this arrangement, the conductor paths and metal contacts preferably consist of aluminum. In order to reduce the starting voltage of the field effect transistors and to produce the ohmic resistors, preferably positive boron ions are implanted into the channel zones and into the regions of the ohmic resistors.

An advantage of the circuit as described above and produced by the process of the present invention results from the fact that the starting voltage of the field effect transistors is approximately 500 mV, and that the resistance of the load resistors lies in the range from 500 kΩ to 1 MΩ.

BRIEF DESCRIPTION OF THE DRAWINGS

Other objects, features and advantages of the invention, along with its organization, construction and operation will be best understood from the following detailed description taken in conjunction with the accompanying drawings, on which.

DESCRIPTION OF THE PREFERRED EMBODIMENT

Figure 1:
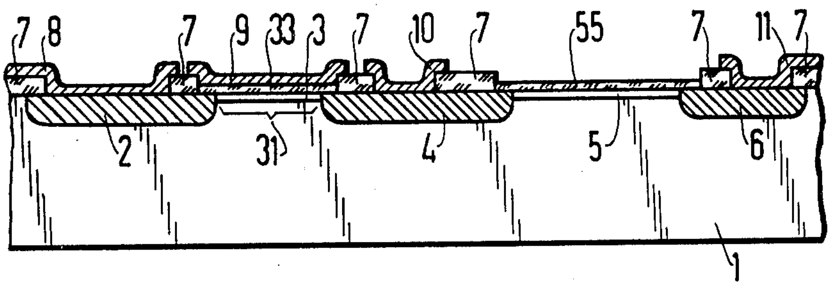
FIG. 1 is a schematic illustration of the construction of the circuit produced by the process of the present invention, which circuit consist of a field effect transistor and a resistor.
Figure 2:
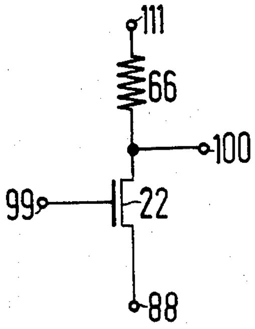
FIG. 2 is a schematic circuit diagram of the circuit illustrated in FIG. 1.

Referring to FIGS. 1 and 2, the production of the circuit which constitutes an inverter and comprises a field effect transistor and a resistor is as follows. In FIG. 1, a substrate 1 of a semiconductor material, preferably n-conducting 10Ωcm silicon is provided. In one processing step a thick oxide layer of $SiO_2$, preferably approximately 1 $\mu$m thick is applied to the substrate 1. In a further processing step, the regions under which the source and drain connection zones are to be produced by means of diffusion are removed from the thick oxide layer. The source zone is, for example, preferably a p-doped zone 2 and the drain zone is, for example, preferable likewise a p-doped zone 4. A channel zone 3 of the field effect transistor is arranged between the two zones 2 and 4. A region 5, in which the ohmic resistor is to be later produced by ion implantation, is arranged, for example, between the p-doped zone 4 and a p-doped connection zone 6.

In a further processing step, the thick oxide layer is removed above those regions (3, 5) in which ions are to be implanted. At the same time, the $SiO_2$ which has been formed during the diffusion in of the source and drain connection zones is removed. To those regions which are now exposed there is applied a thin oxide layer, preferably approximately 0.12 $\mu$m thick. In a further processing step, ions, preferably positive boron ions, are implanted in the region 33 above the channel zone of the field effect transistor and in the region 55 above the region of the ohmic resistor. Because of the considerably higher degree of doping of the diffused p-zones, the implantation of ions into these zones does not have a disturbing effect. The thick oxide layers which remain on the finished circuit are referenced 7.

In the implantation step, the ion implantation in the region 3 reduces the starting voltage of the field effect transistor, and at the same time the ion implantation in the region 5 produces the ohmic load resistor. Preferably, the dose of the ion implantation amounts to $7 \times 10^{11}$ to $1.2 \times 10^{12}$ ions per $cm^2$ and the energy of the ion implantation is approximately 38 keV. In the last two processing steps the thin oxide layer is first removed at those points at which the p-zones are to be contacted and the contacts and conductor paths are then applied by vapor deposition.

In FIG. 2, the field effect transistor of the inverter is referenced 22 and the resistor of the inverter is referenced 66. The circuit points 22, 66, 88, 99 and 111 of the circuit illustrated in FIG. 2 are represented in the circuit arrangement shown in FIG. 1. The point 88 corresponds to the source electrode 8, the point 99 corresponds to the gate electrode 9, the point 100 corresponds to the drain electrode 10 at which the drain terminal of the field effect transistor 99 and one end of the resistor 66 are connected, and the point 111 in FIG. 2 corresponds to the electrode 11 in FIG. 1.

Circuits as described above were produced with the aid of the process according to the present invention. The starting voltage of the field effect transistors amounted to approximately 500 mV, when the ion implantation featured a dose of $10^{12}$ ions/$cm^2$ and an energy of 38 keV. The channel length of the field effect transistors was approximately 8 $\mu$m, this length being represented in FIG. 1 by the reference 31. The channel width, i.e. the extent of the channel zone perpendicular to the plane of the drawing, amounted to approximately 65 $\mu$m. Resistors in the range of from 500 k$\Omega$ to 1 M$\Omega$ were realized by the same implantation step.

Figure 3:
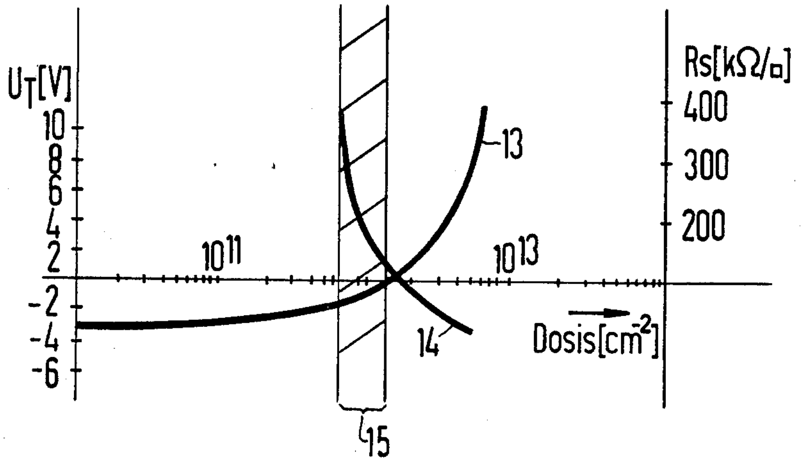
FIG. 3 is a graphic illustration of the layer resistance and the starting voltage of p-channel MOS transistors with respect to the implantation dose.

Referring to FIG. 3, the measured layer resistance $R_S$, i.e. the resistance of a determinate zone of a square area of ohmic resistors, and the measured starting voltage of p-channel MOS transistors are represented with respect to the implantation dose. The curve 13 represents the starting voltage as dependent upon the dose, and the curve 14 represents the layer resistance as dependent upon the dose. The shaded area 15 indicates in which range the dose of the ion implantation may move, that the field effect transistor is still of the normally-off type, and that the resistor is, as a result of the redoping of the substrate on the surface, a p-conductive resistance. As a result of the ion implantation, in the region 15, through the contact potential of the gate metal, due to the redoping of the substrate, there is formed a depletion zone which is sufficiently large to prevent the occurrence of any moving charge carriers in this layer.

The large deviation in the resistance values, which occurs in the production of the circuits by the process of the present invention, and which is stated above, is of no importance since the functioning capacity of the circuits is dependent only on the relationship of the resistance of the load elements to that of the switching transistors, the resistance being high in comparison to the forward resistance of the switching transistors and low in comparison to the reverse resistance thereof. Therefore, the deviation in the resistance values does not impair function.

Figure 4:
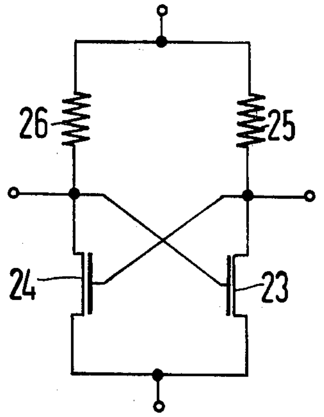
FIG. 4 is a schematic circuit diagram of a storage element consisting of two field effect transistors and two load resistors constructed in accordance with the present invention.

FIG. 4 represents a circuit in accordance with the invention in which a flip-flop is constructed to serve as a storage element and comprises two field effect transistors and two load resistors. The circuit comprises a pair of transistors 23 and 24 having respective load resistors 25 and 26. The circuit illustrated, or a plurality of such circuits, can quite easily be arranged on a common substrate.

In accordance with a further development of the invention, the substrate on which the load resistors and the field effect transistors are arranged is a p-conducting silicon semiconductor body. In this case, the diffused-in zones are n-conducting. The implantation of ions into the channel zone and into the region of the load resistor is carried out with negative phosphorus ions.

Although I have described by invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A process for the production of circuits having at least one field effect transistor with a source, a drain, and a gate, and having a resistor, on a common substrate, which process begins with a substrate body having at least one field effect transistor with source, drain and connection zones formed by diffusion, comprising the steps of: implanting ions adjacent the field effect transistor to produce a resistor, and simultaneously implanting ions in the channel zone of the field effect transistor to decrease the starting voltage of the field effect transistor and form an enhancement type field effect transistor, the simultaneous ion implantation comprising an ion implantation of a predetermined ion type with a predetermined ion energy and within a predetermined ion dosage range, the resistor possessing a value which is high in comparison to the forward resistance of the conductive field effect transistor and low in comparison to the reverse resistance of the field effect transistor.

2. The process set forth in claim 1, comprising the steps of providing n-conducting 10 $\Omega$ cm silicon as the substrate; and diffusing p-conducting zones for the respective source, drain and connection zones.

3. The process as set forth in claim 1, wherein the steps of implanting ions are further defined as implanting positive boron ions.

4. The process as set forth in claim 1, wherein the step of implanting ions is further defined as implanting ions with an energy of approximately 38 keV and of a dosage from between $7 \times 10^{11}$ to $1.2 \times 10^{12}$ ions per $cm^2$.

5. The process as set forth in claim 1, comprising the step of providing p-conducting silicon as the substrate; and diffusing n-conducting zones into the substrate for the source, drain and connection zones.

6. The process as set forth in claim 5 wherein the steps of ion implantation are further defined as implanting negative phosphorus ions.

7. A process for the production of circuits having at least one field effect transistor with a source, a drain, and a gate, and having a resistor, on a common substrate, which process begins with a substrate body having at least one field effect transistor with source, drain and connection zones formed by diffusion, comprising the steps of: implanting ions adjacent the field effect transistor to produce a resistor, and implanting ions in the channel zone of the field effect transistor to decrease the starting voltage of the field effect transistor and form an enhancement type field effect transistor, the resistor possessing a value which is high in comparison to the forward resistance of the conductive field effect transistor and low in comparison to the reverse resistance of the field effect transistor, the process being more specifically defined by the steps of applying a thick oxide layer to the substrate, removing portions of the thick oxide layer in those regions under which the source, drain and connection zones are to be produced, diffusing the substrate to form the source, drain and connection zones, doping the source, drain and connection zones by diffusion, removing the thick oxide layer above the regions into which ions are to be implanted and during this step simultaneously removing the oxide layers which have formed during diffusion above the source, drain and connection zones, applying a thin oxide layer to those regions which are now exposed, implanting ions through the thin oxide layer to form a resistor which extends from the connection zone to one of the other diffused zones, removing the thin oxide layer at the points at which the diffused zones are to be contacted, the connection zones serving as a contact for the resistor, and forming conductor paths and electrodes to those points by vapor deposition.

* * * * *